(12) United States Patent
Li et al.

(10) Patent No.: US 9,349,843 B2
(45) Date of Patent: May 24, 2016

(54) METHOD FOR MANUFACTURING THIN-FILM TRANSISTOR

(71) Applicant: Shenzhen China Star Optoelectronics Technology Co., Ltd., Shenzhen, Guangdong (CN)

(72) Inventors: Wenhui Li, Shenzhen (CN); Chihyuan Tseng, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 134 days.

(21) Appl. No.: 14/235,400

(22) PCT Filed: Oct. 18, 2013

(86) PCT No.: PCT/CN2013/085443
§ 371 (c)(1),
(2) Date: Jan. 27, 2014

(87) PCT Pub. No.: WO2015/054880
PCT Pub. Date: Apr. 23, 2015

(65) Prior Publication Data
US 2015/0111338 A1  Apr. 23, 2015

(30) Foreign Application Priority Data

Oct. 15, 2013  (CN) .......................... 2013 1 0483122

(51) Int. Cl.
*H01L 29/66* (2006.01)
*H01L 21/441* (2006.01)
(Continued)

(52) U.S. Cl.
CPC ...... *H01L 29/66969* (2013.01); *H01L 21/3105* (2013.01); *H01L 29/4908* (2013.01); *H01L 29/7869* (2013.01)

(58) Field of Classification Search
CPC ....... H01L 29/786; H01L 21/02; H01L 29/66; H01L 21/441; H01L 21/465; H01L 29/51; H01L 21/4763; H01L 29/45; H01L 29/29

USPC ............. 257/43, E21.002, E21.459, E29.068, 257/E29.255; 438/104, 641, 677
See application file for complete search history.

(56) References Cited

U.S. PATENT DOCUMENTS

| 2009/0166616 | A1* | 7/2009 | Uchiyama ........................ 257/43 |
| 2011/0089416 | A1* | 4/2011 | Yamazaki et al. ............... 257/43 |
| 2011/0281394 | A1* | 11/2011 | Yamazaki ..................... 438/104 |

FOREIGN PATENT DOCUMENTS

| CN | 1758421 A | 4/2006 |
| CN | 101740398 A | 6/2010 |

(Continued)

*Primary Examiner* — Sheng Zhu
(74) *Attorney, Agent, or Firm* — Andrew C. Cheng (57) ABSTRACT

The present invention provides a method for manufacturing a thin-film transistor. The thin-film transistor has a bottom gate coplanar structure. The method includes the following steps: step (1): providing a substrate (20); step (2): forming a gate terminal (22) on the substrate (20); step (3): forming a gate insulator layer (24) on the gate terminal (22) and the substrate (20); step (4): forming a source/drain terminal (26) on the gate insulator layer (24) and covering the source/drain terminal (26) with a photosensitive material layer (27); step (5): subjecting a surface of the gate insulator layer (24) to a plasma treatment; step (6): removing the photosensitive material layer (27) located on the source/drain terminal (26); and step (7): forming an oxide semiconductor layer (28) on the source/drain terminal (26) and the gate insulator layer (24) and patternizing the oxide semiconductor layer (28). The present invention applies a plasma treatment to a surface of the gate insulator layer to repair defects on an interface between the gate insulator layer and the oxide semiconductor layer so as to improve the electrical characteristics of the thin-film transistor.

11 Claims, 6 Drawing Sheets

(51) Int. Cl.
  *H01L 21/465* (2006.01)
  *H01L 29/51* (2006.01)
  *H01L 21/4763* (2006.01)
  *H01L 29/45* (2006.01)
  *H01L 29/49* (2006.01)
  *H01L 29/786* (2006.01)
  *H01L 21/02* (2006.01)
  *H01L 21/3105* (2006.01)

(56) References Cited

FOREIGN PATENT DOCUMENTS

| | | |
|---|---|---|
| CN | 102064111 A | 5/2011 |
| CN | 102074502 A | 5/2011 |
| CN | 102468340 A | 5/2012 |

\* cited by examiner

METHOD FOR MANUFACTURING THIN-FILM TRANSISTOR

BACKGROUND OF THE INVENTION

1. Field of the Invention

The present invention relates to the field of electronics, and in particular to a method for manufacturing a thin-film transistor.

2. The Related Arts

A thin-film transistor (TFT) has been widely used in electronic devices to serve as a switching device and a driving device. Specifically, the thin-film transistors can be formed on a glass substrate or a plastic substrate so that they are commonly used in the field of planar display devices, such as a liquid crystal display (LCD) and an organic light-emitting display (OLED).

Oxide semiconductors have a relatively high electron mobility (the electron mobility of oxide semiconductors >10 $cm^2/Vs$, while the mobility of a-Si being only 0.5-0.8 $cm^2/Vs$) and, compared to low temperature poly-silicon (LTPS), the oxide semiconductors have a simple manufacturing process and has high compatibility with a-Si manufacturing process so as to have a prosperous future of applications and be a hot spot of research of the industry. Among the studies of the oxide semiconductors, InGaZnO (IGZO) semiconductors are the maturest one.

Although having the advantages of having a relatively high electron mobility and a simple manufacturing process, the InGaZnO semiconductors suffer poor stability, being easily affected by temperature and humidity, electrical properties of an InGaZnO semiconductor TFT being shiftable with time, and having severe requirement for conditions of manufacturing process (such as film formation speed, atmosphere of manufacturing process, temperature of manufacturing process, and control of humidity). Further, besides the InGaZnO semiconductor layers themselves, severe requirements are also needed for insulation layers, contact interfaces between the InGaZnO semiconductor layers and the insulation layers, and the contact interfaces between the InGaZnO semiconductor layers and metals.

Figure 1:
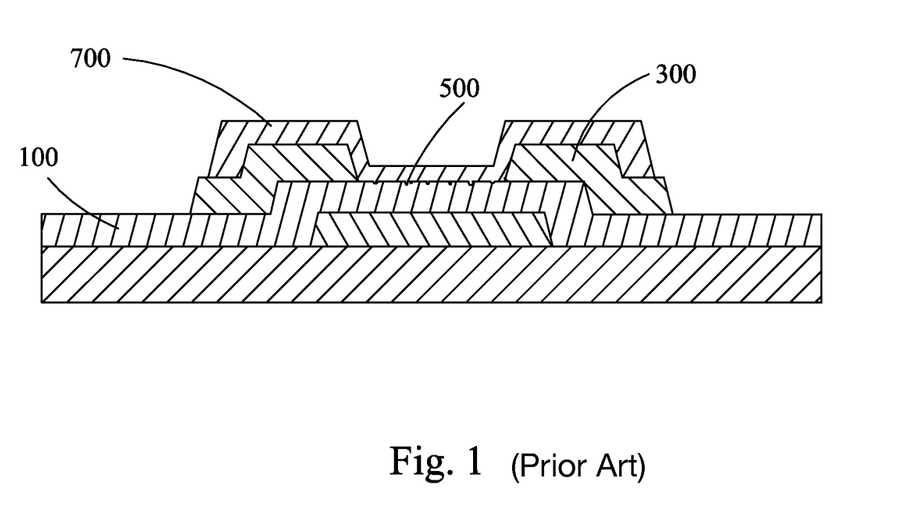
FIG. 1 is a schematic view showing the structure of a conventional thin-film transistor.
Figure 2:
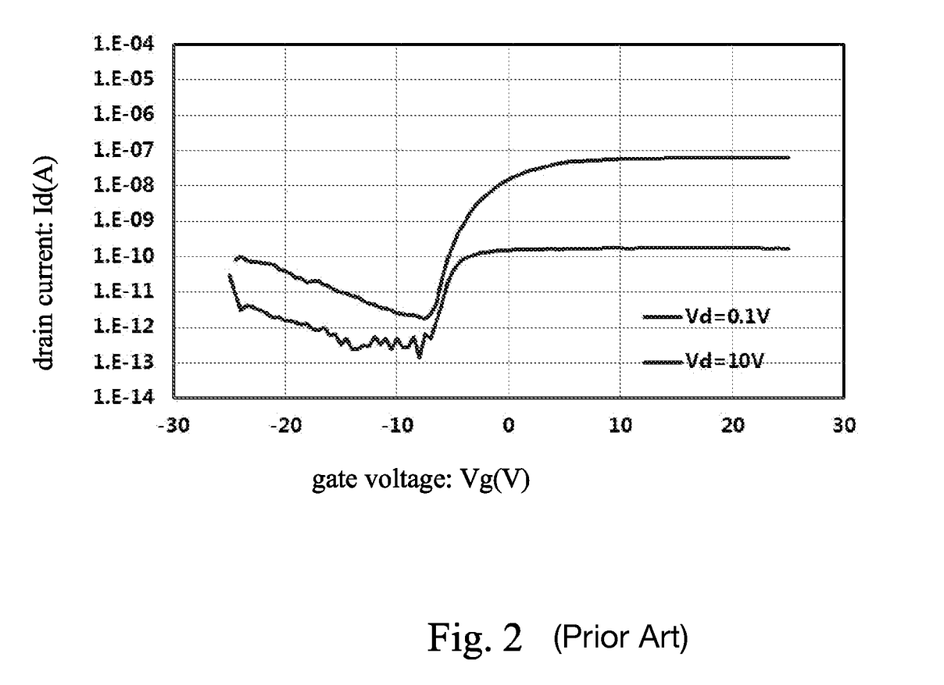
FIG. 2 is a plot showing an electrical characteristic curve of a thin-film transistor of FIG. 1.

For a conventional bottom gate coplanar InGaZnO semiconductor, the InGaZnO semiconductor can avoid, after the formation of a source/drain electrode, the damage of the InGaZnO semiconductor layer caused by a manufacturing process of a source/drain terminal of a back channel etching (BCE) TFT. However, in the bottom gate coplanar structure (as shown in FIG. 1), due to a gate insulator (GI) 100 contains defects in itself and the subsequent manufacturing process of a source/drain terminal 300 potentially causing damage to a surface of the GI layer that leads to more defects 500 on the surface of the GI layer 5100, there are more defects 500 existing between an InGaZnO semiconductor layer 700 and the GI layer 100 after the formation of the InGaZnO semiconductor layer 700, imposing a limitation to the mobility of electrons/holes and giving negative influence to the electrical properties of the TFT. Referring to FIG. 2, which shows a plot of an electrical characteristic curve of a conventional bottom gate coplanar TFT, it can be seen from the curve that when a drain voltage Vd=0.1V, the maximum level of a drain current Id is only $10^{-10}$ A; and when the drain voltage Vd=10V, the maximum level of the drain current Id is only $10^{-7}$ A. The electrical property is thus relatively poor.

SUMMARY OF THE INVENTION

An object of the present invention is to provide a method for manufacturing a thin-film transistor, which can effective repair defects in an interface between a gate insulator layer and an oxide semiconductor layer so as to improve an electrical property of a bottom gate coplanar thin-film transistor.

To achieve the above objects, the present invention provides a method for manufacturing a thin-film transistor, wherein the thin-film transistor has a bottom gate coplanar structure. The method comprises the following steps:

(1) providing a substrate;
(2) forming a gate terminal on the substrate;
(3) forming a gate insulator layer on the gate terminal and the substrate;
(4) forming a source/drain terminal on the gate insulator layer and covering the source/drain terminal with a photosensitive material layer;
(5) subjecting a surface of the gate insulator layer to a plasma treatment;
(6) remove the photosensitive material layer located on the source/drain terminal; and
(7) forming an oxide semiconductor layer on the source/drain terminal and the gate insulator layer and patternizing the oxide semiconductor layer.

The oxide semiconductor layer is an InGaZnO semiconductor layer.

The plasma comprises chlorine based plasma.

With the plasma treatment being carried out with the chlorine based plasma, an internal pressure of a chamber is 2.0-100 mT, high radiation frequency being at 10-30000 W, low radiation frequency being at 10-20000 W, cooling air pressure being 10-10000 mT, gas volume flow being 10-5000 sccm, treatment time being 1-150 S.

The plasma comprises fluorine based plasma.

With the plasma treatment being carried out with the fluorine based plasma, an internal pressure of a chamber is 2.0-100 mT, high radiation frequency being at 10-30000 W, low radiation frequency being at 10-20000 W, cooling air pressure being 10-10000 mT, gas volume flow being 10-5000 sccm, treatment time being 1-150 S.

The plasma is oxygen based plasma, nitrogen based plasma, phosphorous based plasma, or carbon based plasma.

The substrate is a glass substrate.

Step (4) comprises: sequentially forming a metal layer and the photosensitive material layer on the gate insulator layer, subjecting the photosensitive material layer to exposure through a mask, removing an exposed portion of the photosensitive material layer and subjecting an exposed portion of the metal layer to etching so as to form the source/drain terminal and the source/drain terminal being covered with the photosensitive material layer.

The gate terminal and the source/drain terminal comprise aluminum and the gate insulator layer comprises one of silicon oxide and silicon nitride or a combination thereof.

The present invention also provides a method for manufacturing a thin-film transistor, wherein the thin-film transistor has a bottom gate coplanar structure. The method comprises the following steps:

(1) providing a substrate;
(2) forming a gate terminal on the substrate;
(3) forming a gate insulator layer on the gate terminal and the substrate;
(4) forming a source/drain terminal on the gate insulator layer and covering the source/drain terminal with a photosensitive material layer;
(5) subjecting a surface of the gate insulator layer to a plasma treatment;
(6) remove the photosensitive material layer located on the source/drain terminal; and (7) forming an oxide semiconductor layer on the source/drain terminal and the gate insulator layer and patternizing the oxide semiconductor layer;

wherein the oxide semiconductor layer is an InGaZnO semiconductor layer;

wherein the plasma comprises chlorine based plasma; and wherein with the plasma treatment being carried out with the chlorine based plasma, an internal pressure of a chamber is 2.0-100 mT, high radiation frequency being at 10-30000 W, low radiation frequency being at 10-20000 W, cooling air pressure being 10-10000 mT, gas volume flow being 10-5000 sccm, treatment time being 1-150 S.

The substrate is a glass substrate.

Step (4) comprises: sequentially forming a metal layer and the photosensitive material layer on the gate insulator layer, subjecting the photosensitive material layer to exposure through a mask, removing an exposed portion of the photosensitive material layer and subjecting an exposed portion of the metal layer to etching so as to form the source/drain terminal and the source/drain terminal being covered with the photosensitive material layer.

The gate terminal and the source/drain terminal comprise aluminum and the gate insulator layer comprises one of silicon oxide and silicon nitride or a combination thereof.

The efficacy of the present invention is that the present invention provides a method for manufacturing a thin-film transistor, which applies plasma treatment to a surface of a gate insulator layer to effectively repair defects in an interface between the gate insulator layer and an oxide semiconductor layer so as to improve the electrical characteristics of a bottom gate coplanar thin-film transistor.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 3:
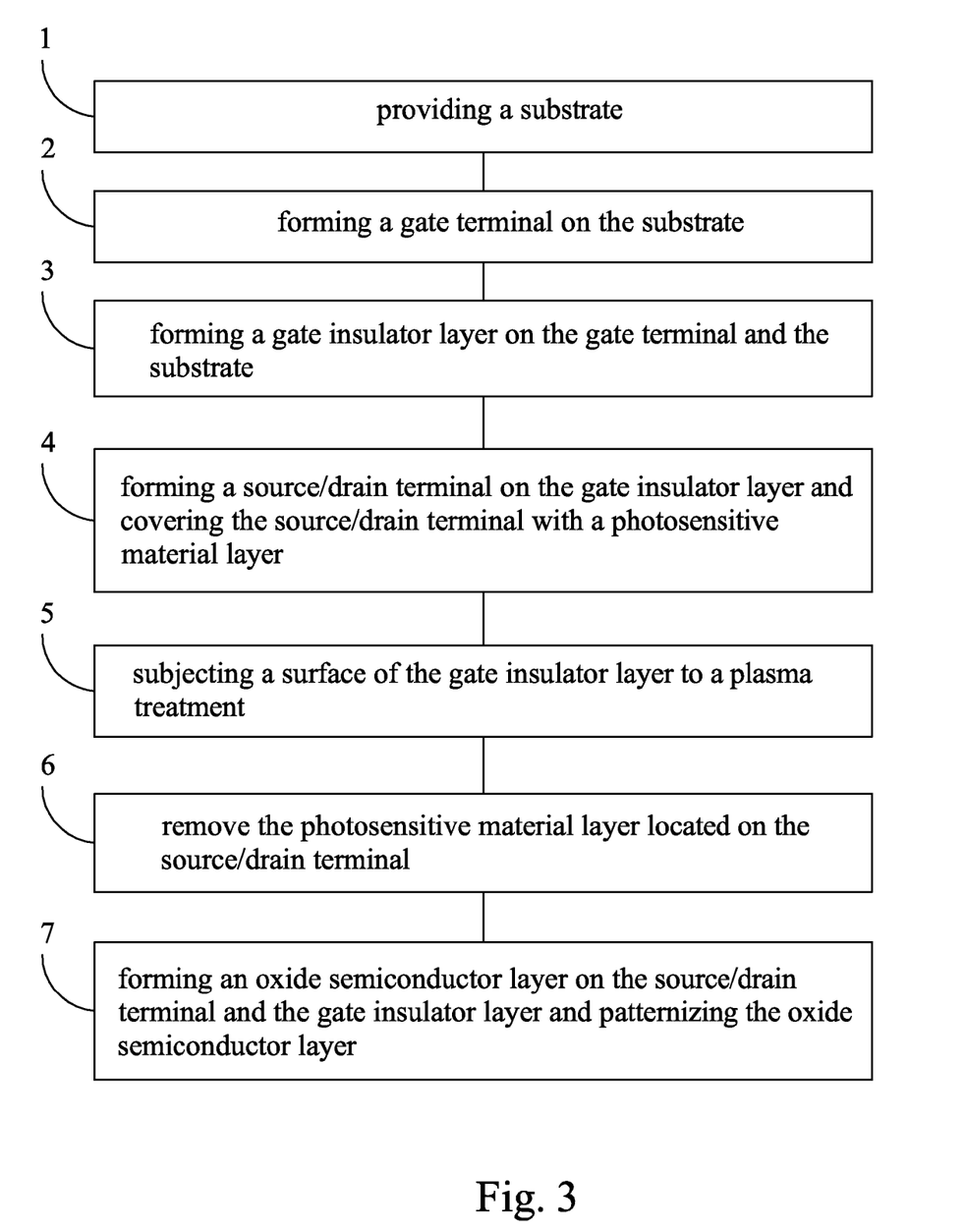
FIG. 3 is a flow chart illustrating a method for manufacturing a thin-film transistor according to the present invention.

Referring to Referring to FIG. 3, the present invention provides a method for manufacturing a thin-film transistor, wherein the thin-film transistor has a bottom gate coplanar structure, the method comprising the following steps:

Step 1: providing the substrate 20.

The substrate 20 is a transparent substrate, and preferably a glass substrate or a plastic substrate. In the instant embodiment, the substrate 20 is a glass substrate.

Step 2: forming a gate terminal 22 on the substrate 20.

Figure 4:
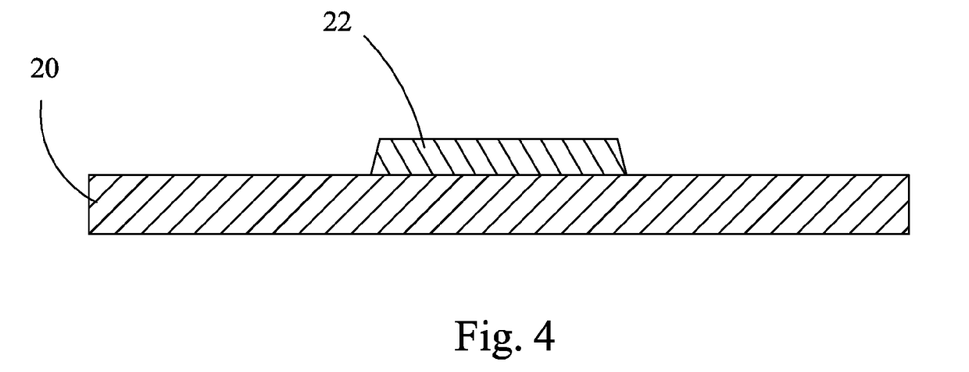
FIGS. 4-9 are schematic views illustrating the process of the method for manufacturing a thin-film transistor according to the present invention.

Referring to FIG. 4, a specific process can be as follows: sequentially depositing a metal layer and a photosensitive material layer on the substrate 20; subjecting the photosensitive material layer to exposure through a mask or a halftone mask so as to duplicate a predetermined pattern formed on the mask or halftone mask on the photosensitive material layer; then removing the exposed portion of the photosensitive material layer so as to expose the metal layer; removing the exposed portion of the metal layer through etching so as to form a predetermined structure of the gate terminal 22 on the metal layer; and finally, removing the un-exposed portion of the photosensitive material layer.

The metal layer is generally one of an aluminum layer, a copper layer, and a molybdenum layer or a combination thereof.

Figure 5:
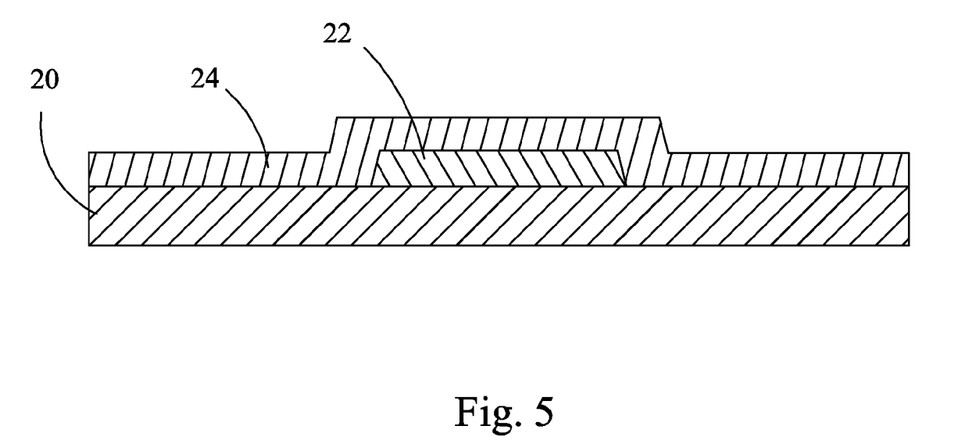

Step 3: forming a gate insulator layer 24 on the gate terminal 22 and the substrate 20.

Referring to FIG. 5, the gate insulator layer 24 generally comprises one of silicon oxide and silicon nitride or a combination thereof and is formed in a way similar to that of the above described gate terminal 22 so that repeated description will be omitted.

Figure 6:
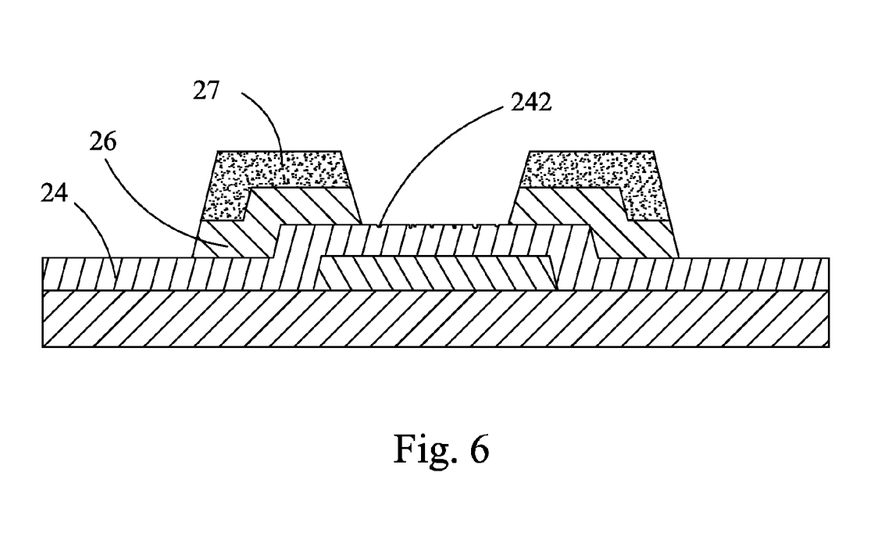

Step 4: forming a source/drain terminal 26 on the gate insulator layer 24 and covering the source/drain terminal 26 with a photosensitive material layer 27.

Referring to FIG. 6, specifically, the operation is as follows: sequentially forming a metal layer and the photosensitive material layer 27 on the gate insulator layer 24, subjecting the photosensitive material layer 27 to exposure through a mask, removing an exposed portion of the photosensitive material layer 27 and subjecting an exposed portion of the metal layer to etching so as to form a predetermined structure of the source/drain terminal 26 in the metal layer and the source/drain terminal 26 being covered with the photosensitive material layer 27.

Figure 7:
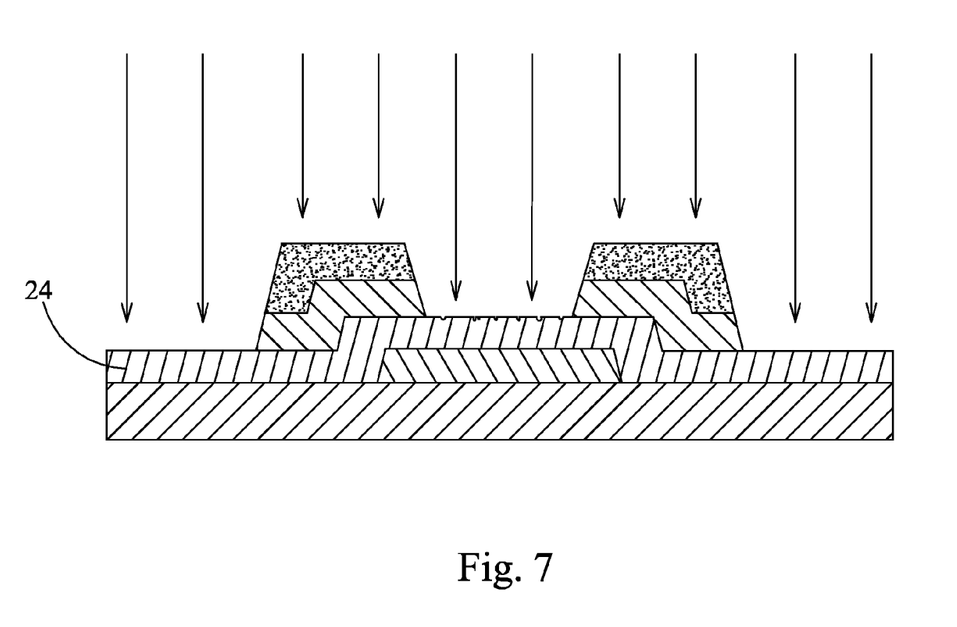

Step 5: subjecting a surface 242 of the gate insulator layer 24 to a plasma treatment.

Referring to FIG. 7, through treatment of the surface 242 of the gate insulator layer 24 with plasma, defects on the surface 242 of the gate insulator layer 24 can be repaired.

In the instant embodiment, the plasma used is a chlorine based plasma. When the plasma treatment is carried out with a chlorine based plasma, internal pressure of the chamber is 2.0-100 mT, high radiation frequency being at 10-30000 W, low radiation frequency being at 10-20000 W, cooling air pressure being 10-10000 mT, gas volume flow being 10-5000 sccm, treatment time being 1-150 S.

Figure 8:
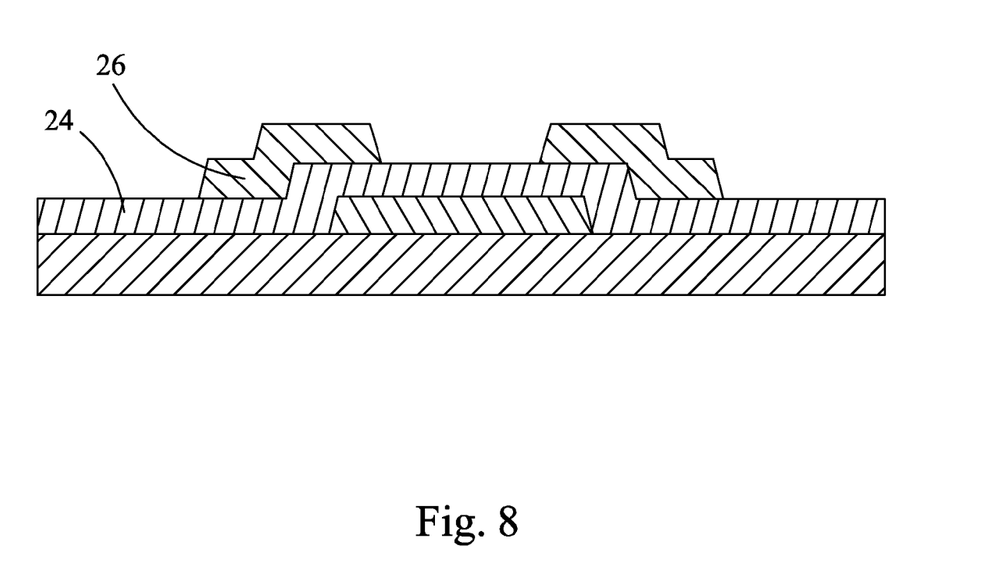

Step 6: removing the photosensitive material layer 27 located on the source/drain terminal 26.

Referring to FIG. 8, the photosensitive material layer 27 that is located on the source/drain terminal 26 is removed in order to expose the source/drain terminal 26 that is covered by the photosensitive material layer 27.

Figure 9:
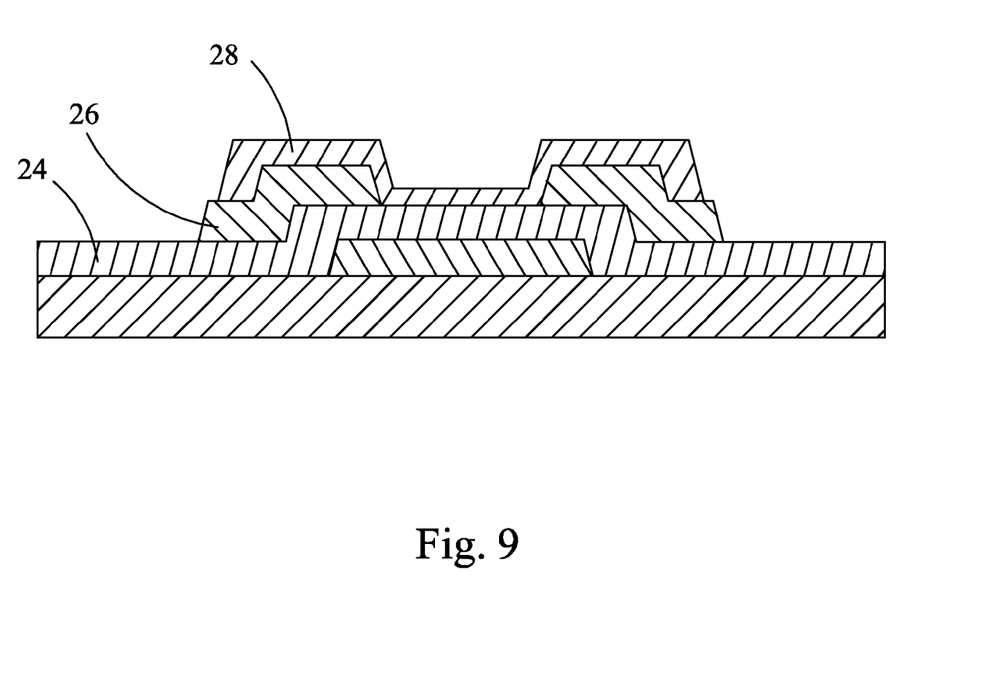

Step 7: forming an oxide semiconductor layer 28 on the source/drain terminal 26 and the gate insulator layer 24 and patternizing the oxide semiconductor layer 28.

Referring to FIG. 9, in the instant embodiment, the oxide semiconductor layer 28 is an InGaZnO semiconductor layer, which is formed in a way similar to that of the above descried gate terminal 22 so that repeated description will be omitted.

Figure 10:
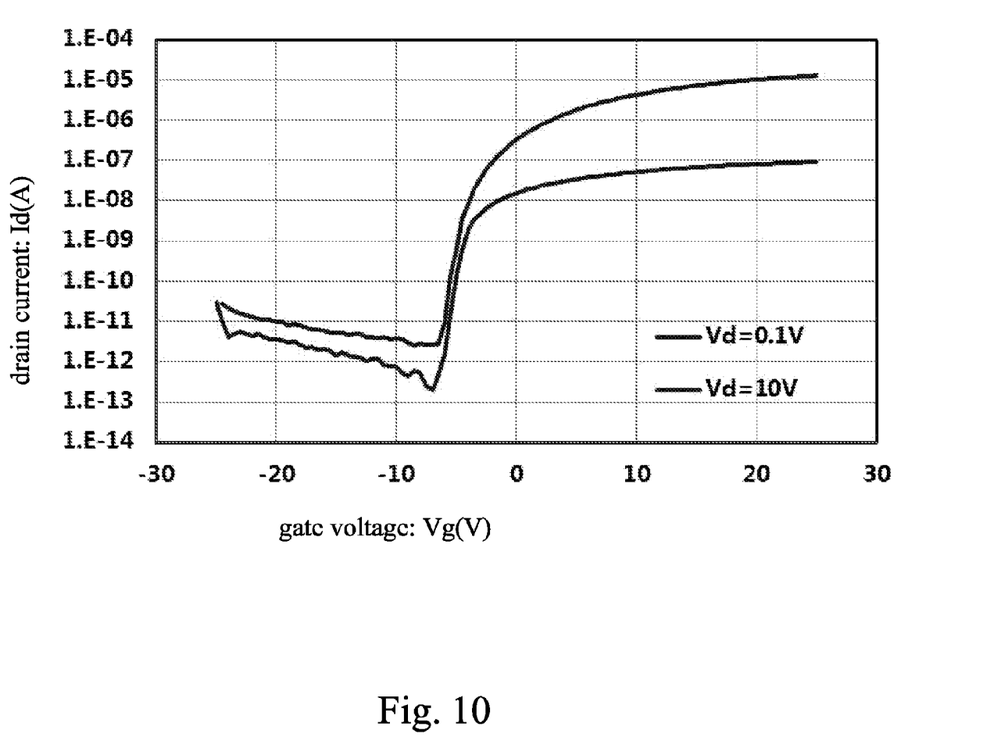
FIG. 10 is a plot showing an electrical characteristic curve of a thin-film transistor manufactured with the method for manufacturing a thin-film transistor according to the present invention.

Referring to FIG. 10, which shows a plot of an electrical characteristic curve of a thin-film transistor manufactured with the above steps, it can be seen from the curve that when a drain voltage Vd=0.1V, the maximum level of a drain current Id reaches $10^{-7}$ A; and when the drain voltage Vd=10V, the maximum level of the drain current Id can reach $10^{-5}$ A. Compared to the conventional thin-film transistor, the electrical property has been significantly improved.

It is noted that the plasma used can alternatively be fluorine based plasma, an oxygen based plasma, a nitrogen based plasma, a phosphorous based plasma, or a carbon based plasma, which can similarly achieve the above described technical effect.

Specifically, when the plasma treatment is carried out with a fluorine based plasma, internal pressure of the chamber is 2.0-100 mT, high radiation frequency being at 10-30000 W, low radiation frequency being at 10-20000 W, cooling air pressure being 10-10000 mT, gas volume flow being 10-5000 sccm, treatment time being 1-150 S.

In summary, the present invention provides a method for manufacturing a thin-film transistor, which applies plasma treatment to a surface of a gate insulator layer to effectively repair defects in an interface between the gate insulator layer and an oxide semiconductor layer so as to improve the electrical characteristics of a bottom gate coplanar thin-film transistor.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a thin-film transistor, wherein the thin-film transistor has a bottom gate coplanar structure, the method comprising the following steps:
   (1) providing a substrate;
   (2) forming a gate terminal on the substrate;
   (3) forming a gate insulator layer on the gate terminal and the substrate;
   (4) forming a source/drain terminal on the gate insulator layer and covering the source/drain terminal with a photosensitive material layer, wherein a metal layer is first formed on the gate insulator layer and then covered with the photosensitive material layer, the photosensitive material layer being subjected to exposure through a mask to remove an exposed portion of the photosensitive material layer so as to expose a portion of the metal layer that is then subjected to etching to remove the portion of the metal layer with a remaining portion of the metal layer forming the source/drain terminal and a surface of the gate insulator layer exposed through the removal of the portion the metal layer, surface damages being caused in the exposed surface of the gate insulator layer by the etching;
   (5) subjecting the exposed surface of the gate insulator layer to a plasma treatment by applying halogen based plasma to the surface of the gate insulator layer that has already formed on the gate terminal and the substrate to repair the surface damages;
   (6) remove the photosensitive material layer located on the source/drain terminal; and
   (7) forming an oxide semiconductor layer on the source/drain terminal and the exposed surface of the gate insulator layer with the surface damages between the gate insulator layer and the oxide semiconductor being repaired through the application of the plasma treatment and patternizing the oxide semiconductor layer.

2. The method for manufacturing a thin-film transistor as claimed in claim 1, wherein the oxide semiconductor layer is an InGaZnO semiconductor layer.

3. The method for manufacturing a thin-film transistor as claimed in claim 1, wherein the plasma comprises chlorine based plasma.

4. The method for manufacturing a thin-film transistor as claimed in claim 3, wherein with the plasma treatment being carried out with the chlorine based plasma, an internal pressure of a chamber is 2.0-100 mT, high radiation frequency being at power of 10-30000 W, low radiation frequency being at power of 10-20000 W, cooling air pressure being 10-10000 mT, gas volume flow being 10-5000 sccm, treatment time being 1-150 S.

5. The method for manufacturing a thin-film transistor as claimed in claim 1, wherein the plasma comprises fluorine based plasma.

6. The method for manufacturing a thin-film transistor as claimed in claim 5, wherein with the plasma treatment being carried out with the fluorine based plasma, an internal pressure of a chamber is 2.0-100 mT, high radiation frequency being at power of 10-30000 W, low radiation frequency being at power of 10-20000 W, cooling air pressure being 10-10000 mT, gas volume flow being 10-5000 sccm, treatment time being 1-150 S.

7. The method for manufacturing a thin-film transistor as claimed in claim 1, wherein the substrate is a glass substrate.

8. The method for manufacturing a thin-film transistor as claimed in claim 1, wherein the gate terminal and the source/drain terminal comprise aluminum and the gate insulator layer comprises one of silicon oxide and silicon nitride or a combination thereof.

9. A method for manufacturing a thin-film transistor, wherein the thin-film transistor has a bottom gate coplanar structure, the method comprising the following steps:
   (1) providing a substrate;
   (2) forming a gate terminal on the substrate;
   (3) forming a gate insulator layer on the gate terminal and the substrate;
   (4) forming a source/drain terminal on the gate insulator layer and covering the source/drain terminal with a photosensitive material layer, wherein a metal layer is first formed on the gate insulator layer and then covered with the photosensitive material layer, the photosensitive material layer being subjected to exposure through a mask to remove an exposed portion of the photosensitive material layer so as to expose a portion of the metal layer that is then subjected to etching to remove the portion of the metal layer with a remaining portion of the metal layer forming the source/drain terminal and a surface of the gate insulator layer exposed through the removal of the portion the metal layer, surface damages being caused in the exposed surface of the gate insulator layer by the etching;
   (5) subjecting the exposed surface of the gate insulator layer to a plasma treatment by applying halogen based plasma to the surface of the gate insulator layer that has already formed on the gate terminal and the substrate to repair the surface damages;
   (6) remove the photosensitive material layer located on the source/drain terminal; and
   (7) forming an oxide semiconductor layer on the source/drain terminal and the exposed surface of the gate insulator layer with the surface damages between the gate insulator layer and the oxide semiconductor being repaired through the application of the plasma treatment and patternizing the oxide semiconductor layer;

wherein the oxide semiconductor layer is an InGaZnO semiconductor layer;

wherein the plasma comprises chlorine based plasma; and wherein with the plasma treatment being carried out with the chlorine based plasma, an internal pressure of a chamber is 2.0-100 mT, high radiation frequency being at power of 10-30000 W, low radiation frequency being at power of 10-20000 W, cooling air pressure being 10-10000 mT, gas volume flow being 10-5000 sccm, treatment time being 1-150 S.

10. The method for manufacturing a thin-film transistor as claimed in claim 9, wherein the substrate is a glass substrate.

11. The method for manufacturing a thin-film transistor as claimed in claim 9, wherein the gate terminal and the source/drain terminal comprise aluminum and the gate insulator layer comprises one of silicon oxide and silicon nitride or a combination thereof.

* * * * *